United States Patent
Kim et al.

(10) Patent No.: US 10,340,318 B2
(45) Date of Patent: Jul. 2, 2019

(54) DISPLAY DEVICE HAVING BANK WITH GROOVE PORTION AND PIXEL DEFINITION PORTION

(71) Applicant: LG DISPLAY CO., LTD., Seoul (KR)

(72) Inventors: Dongyoon Kim, Paju-si (KR);
Younyeol Yu, Goyang-si (KR);
Haeyoon Jung, Goyang-si (KR)

(73) Assignee: LG DISPLAY CO., LTD., Seoul (KR)

(*) Notice: Subject to any disclaimer, the term of this patent is extended or adjusted under 35 U.S.C. 154(b) by 0 days.

(21) Appl. No.: 15/819,914

(22) Filed: Nov. 21, 2017

(65) Prior Publication Data

US 2018/0151646 A1 May 31, 2018

(30) Foreign Application Priority Data

Nov. 25, 2016 (KR) .................. 10-2016-0158663

(51) Int. Cl.
*H04L 27/32* (2006.01)
*H01L 27/32* (2006.01)
*H01L 51/00* (2006.01)
*H01L 51/52* (2006.01)

(52) U.S. Cl.
CPC ...... *H01L 27/3246* (2013.01); *H01L 27/3262* (2013.01); *H01L 51/0097* (2013.01); *H01L 51/524* (2013.01)

(58) Field of Classification Search
CPC ............. H01L 27/3246; H01L 27/3248; H01L 27/3283; H01L 27/3295; H01L 51/5012; H01L 51/5253
See application file for complete search history.

(56) References Cited

U.S. PATENT DOCUMENTS

2004/0004434 A1* 1/2004 Nishi .................... H01L 27/322
313/506
2012/0244285 A1  9/2012 Ando et al.
2015/0090993 A1  4/2015 Tokuda et al.

FOREIGN PATENT DOCUMENTS

| JP | 2902-324666 A | 11/2002 |
| JP | 2006-252839 A | 9/2006 |
| JP | 2012-201007 A | 10/2012 |
| JP | 2016-171088 A | 9/2016 |
| KR | 10-2015-0059189 A | 6/2015 |
| KR | 10-2016-0032749 A | 3/2016 |

* cited by examiner

*Primary Examiner* — Hoai V Pham
(74) *Attorney, Agent, or Firm* — Birch, Stewart, Kolasch & Birch, LLP

(57) ABSTRACT

A display device for preventing a defective operation and dark spots resulting from fine bubbles is disclosed. The display device includes a flexible substrate, a thin film transistor disposed on the flexible substrate, a first electrode connected to the thin film transistor, a bank layer including a pixel definition portion exposing the first electrode and a groove portion spaced apart from the pixel definition portion, an organic layer disposed on the first electrode and the bank layer, and a second electrode disposed on the organic layer.

20 Claims, 17 Drawing Sheets

DISPLAY DEVICE HAVING BANK WITH GROOVE PORTION AND PIXEL DEFINITION PORTION

This application claims the priority benefit of Korean Patent Application No. 10-2016-0158663 filed on Nov. 25, 2016, the disclosure of which is incorporated herein by reference in its entirety.

BACKGROUND OF THE INVENTION

Field of the Invention

The embodiments of the present disclosure relate to a display device, and more particularly to a display device for preventing a defective operation resulting from fine bubbles and reducing a stress of components.

Discussion of the Related Art

With the development of an information society, demands for display devices displaying an image are increasing in various ways. In the field of display devices, a large-sized cathode ray tube (CRT) has been rapidly replaced by a flat panel display (FPD) having advantages of a thin profile, light weight, and a large-sized screen. Examples of the flat panel display include a liquid crystal display (LCD), a plasma display panel (PDP), an organic light emitting diode (OLED) display, and an electrophoresis display (EPD).

An OLED display includes self-emitting elements capable of emitting light by themselves and has advantages of a fast response time, a high emission efficiency, a high luminance, and a wide viewing angle. In particular, the OLED display can be manufactured on a flexible plastic substrate. In addition, the OLED display has advantages of a lower driving voltage, lower power consumption, and better color tone as compared to a plasma display panel or an inorganic electroluminescent display.

In the OLED display including the flexible plastic substrate, polyimide is coated on a glass substrate, elements such as a thin film transistor and an organic light emitting diode are manufactured on the polyimide substrate, and a metal sheet is attached to the polyimide substrate using an adhesive and performs the encapsulation. After a chip-on film (COF) is attached to a pad portion and the glass substrate is separated from the polyimide substrate, a protective film is attached to the polyimide substrate. Thus, the OLED display including the flexible polyimide substrate is manufactured.

In a process for attaching the metal sheet to the substrate on which the elements are formed, fine bubbles are generated. The fine bubbles are trapped inside the elements and appear to protrude from the surface of the metal sheet. However, because the metal sheet has strong rigidity after the glass substrate is separated, the fine bubbles are pushed into the organic light emitting diode by a pushing force of the metal sheet. Hence, there is a problem that an emission layer of the organic light emitting diode is peeled off. Thus, many dark spots occur due to the peeling of the emission layer, resulting in a defective operation.

SUMMARY OF THE INVENTION

The present disclosure provides a display device capable of preventing a defective operation and dark spots resulting from fine bubbles and reducing a stress.

In one aspect, there is provided a display device including a flexible substrate, a thin film transistor disposed on the flexible substrate, a first electrode connected to the thin film transistor, a bank layer including a pixel definition portion exposing the first electrode and a groove portion spaced apart from the pixel definition portion, an organic layer disposed on the first electrode and the bank layer, and a second electrode disposed on the organic layer.

The groove portion is formed by concavely depressing a portion of the bank layer or is formed in a shape of a hole passing through the bank layer.

The groove portion does not overlap the thin film transistor and the first electrode.

The display device further includes a protective layer disposed on the second electrode, an adhesive layer disposed on the protective layer, and an upper protective member disposed on the adhesive layer.

A first collection space is provided between the protective layer and the adhesive layer in the pixel definition portion of the bank layer, and a second collection space is provided between the protective layer and the adhesive layer in the groove portion of the bank layer.

In another aspect, there is provided a display device including a plurality of subpixels defined by an intersection of gate lines, data lines, and power lines on a flexible substrate, the data lines and the power lines intersecting the gate lines, wherein each subpixel includes an emission portion emitting light and a circuit portion in which a thin film transistor is at least disposed, a first electrode connected to the thin film transistor, a bank layer including a pixel definition portion exposing the first electrode and a groove portion spaced apart from the pixel definition portion, an organic layer disposed on the first electrode and the bank layer, and a second electrode disposed on the organic layer.

The groove portion overlaps at least one of the gate lines.

The groove portion overlaps at least one of the data lines and at least one of the power lines.

The groove portion is formed by concavely depressing a portion of the bank layer or is formed in a shape of a hole passing through the bank layer.

The groove portion does not overlap the thin film transistor and the first electrode.

The display device further includes a protective layer disposed on the second electrode, an adhesive layer disposed on the protective layer, and an upper protective member disposed on the adhesive layer.

A first collection space is provided between the protective layer and the adhesive layer in the pixel definition portion of the bank layer, and a second collection space is provided between the protective layer and the adhesive layer in the groove portion of the bank layer.

In another aspect, there is provided a display device including a flexible substrate having an emission portion and a circuit portion; a thin film transistor disposed on the flexible substrate at the circuit portion; a first electrode connected to the thin film transistor; an organic layer disposed on the first electrode; a protective layer disposed on the organic layer; an adhesive layer selectively contacting the protective layer; and a second electrode disposed on the organic layer.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIGS. 18 to 20 illustrate images when an OLED display according to a comparative example is turned on;

DETAILED DESCRIPTION OF THE EMBODIMENTS

Reference will now be made in detail to embodiments of the disclosure, examples of which are illustrated in the accompanying drawings. Wherever possible, the same reference numbers will be used throughout the drawings to refer to the same or like parts. It will be paid attention that a detailed description of known arts will be omitted if it is determined that the arts can obscure the embodiments of the disclosure. Names of the respective elements used in the following explanations are selected only for convenience of writing the specification and may thus be different from those used in actual products.

A display device according to an embodiment of the disclosure is a flexible display device, in which a display element is formed on a flexible substrate. Examples of the flexible display device include an organic light emitting diode (OLED) display, a liquid crystal display (LCD), and an electrophoresis display. Embodiments are described using the OLED display by way of example. An OLED display includes an organic layer formed of an organic material between a first electrode serving as an anode and a second electrode serving as a cathode. The OLED display is a self-emission display device configured to form hole-electron pairs, i.e., excitons by combining holes received from the first electrode and electrons received from the second electrode inside the organic layer and emit light by energy generated when the excitons return to a ground level.

Embodiments of the disclosure are described below with reference to FIGS. 1 to 22.

Figure 1:
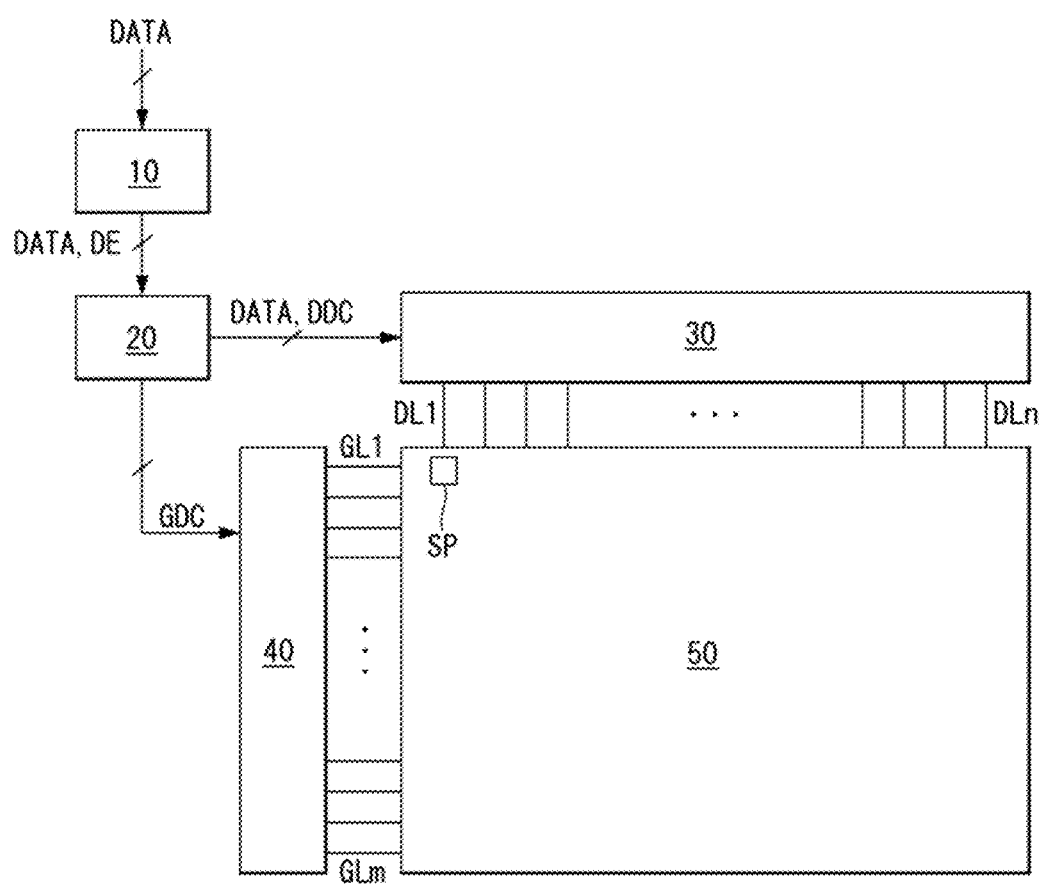
FIG. 1 is a schematic block diagram of an organic light emitting diode (OLED) display according to an embodiment of the disclosure.
Figure 2:
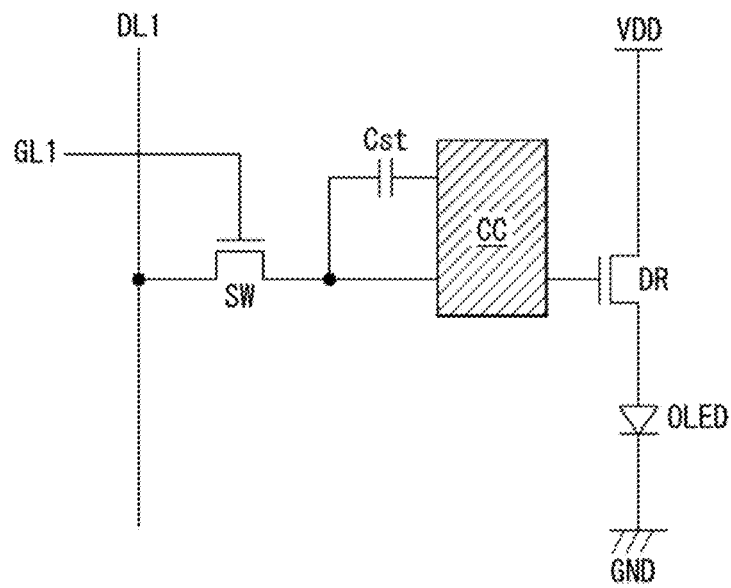
FIG. 2 illustrates a first example of a circuit configuration of a subpixel.
Figure 3:
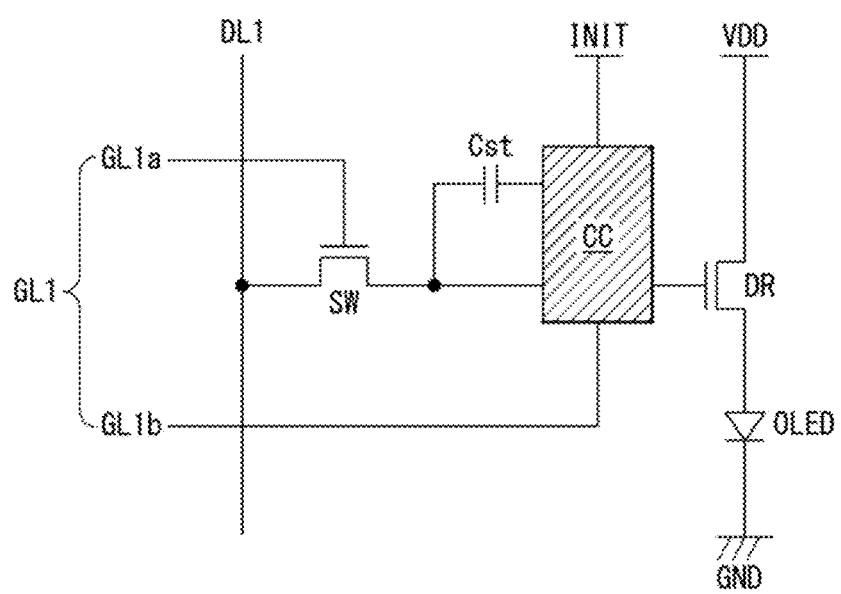
FIG. 3 illustrates a second example of a circuit configuration of a subpixel.

FIG. 1 is a schematic block diagram of an OLED display according to an embodiment of the disclosure. FIG. 2 illustrates a first example of a circuit configuration of a subpixel. FIG. 3 illustrates a second example of a circuit configuration of a subpixel.

Referring to FIG. 1, an OLED display according to an embodiment of the disclosure includes an image processing unit 10, a timing controller 20, a data driver 30, a gate driver 40, and a display panel 50.

The image processing unit 10 outputs a data signal DATA and a data enable signal DE supplied from the outside. The image processing unit 10 may output one or more of a vertical sync signal, a horizontal sync signal, and a clock signal in addition to the data enable signal DE. The image processing unit 10 is formed on a system circuit board as an integrated circuit (IC).

The timing controller 20 receives the data signal DATA and driving signals including the data enable signal DE or the vertical sync signal, the horizontal sync signal, the clock signal, etc. from the image processing unit 10.

The timing controller 20 outputs a gate timing control signal GDC for controlling operation timing of the gate driver 40 and a data timing control signal DDC for controlling operation timing of the data driver 30 based on the driving signals. The timing controller 20 may be formed on a control circuit board as an IC.

The data driver 30 samples and latches the data signal DATA received from the timing controller 20 in response to the data timing control signal DDC supplied from the timing controller 20 and converts the sampled and latched data signal DATA using gamma reference voltages. The data driver 30 outputs the converted data signal DATA to data lines DL1 to DLn. The data driver 30 is attached to a substrate as an IC.

The gate driver 40 outputs a gate signal while shifting a level of a gate voltage in response to the gate timing control signal GDC supplied from the timing controller 20. The gate driver 40 outputs the gate signal to gate lines GL1 to GLm. The gate driver 40 is formed on a gate circuit board as an IC or is formed on the display panel 50 in a gate-in-panel (GIP) manner.

The display panel 50 displays an image in response to the data signal DATA and the gate signal respectively received from the data driver 30 and the gate driver 40. The display panel 50 includes subpixels SP for displaying an image.

As shown in FIG. 2, each subpixel may include a switching transistor SW, a driving transistor DR, a compensation circuit CC, and an organic light emitting diode (OLED). The OLED operates to emit light based on a driving current generated by the driving transistor DR.

The switching transistor SW performs a switching operation so that a data signal supplied through a first data line DL1 is stored in a capacitor Cst as a data voltage in response to a gate signal supplied through a gate line GL1. The driving transistor DR enables a driving current to flow between a high potential power line VDD and a low potential power line GND based on the data voltage stored in the capacitor Cst. The compensation circuit CC is a circuit for compensating for a threshold voltage of the driving transistor DR. A capacitor connected to the switching transistor SW or the driving transistor DR may be mounted inside the compensation circuit CC. The compensation circuit CC includes one or more thin film transistors (TFTs) and a capacitor. Configuration of the compensation circuit CC may be variously changed depending on a compensation method. A brief description of the compensation circuit CC will be made.

As shown in FIG. 3, a subpixel including the compensation circuit CC may further include a signal line and a power line for driving a compensation TFT and supplying a predetermined signal or electric power. The gate line GL1 may include a 1-1 gate line GL1a supplying the gate signal to the switching transistor SW and a 1-2 gate line GL1b for driving the compensation TFT included in the subpixel. The added power line may be defined as an initialization power line INIT for initializing a predetermined node of the subpixel to a predetermined voltage. However, this is merely an example, and embodiments are not limited thereto.

FIGS. 2 and 3 illustrate that one subpixel includes the compensation circuit CC by way of example. However, the compensation circuit CC may be omitted when an object (for example, the data driver 30) to be compensated is positioned outside the subpixel. The subpixel has a configuration of 2T(Transistor)1C(Capacitor) in which the switching transistor SW, the driving transistor DR, the capacitor, and the OLED are provided. However, when the compensation circuit CC is added to the subpixel, the subpixel may have various configurations such as 3T1C, 4T2C, 5T2C, 6T2C, 7T2C, and the like. Also, FIGS. 2 and 3 illustrate that the compensation circuit CC is positioned between the switching transistor SW and the driving transistor DR by way of an example. However, the compensation circuit CC may be further positioned between the driving transistor DR and the OLED. The position and the structure of the compensation circuit CC are not limited to the ones illustrated in FIGS. 2 and 3.

Figure 4:
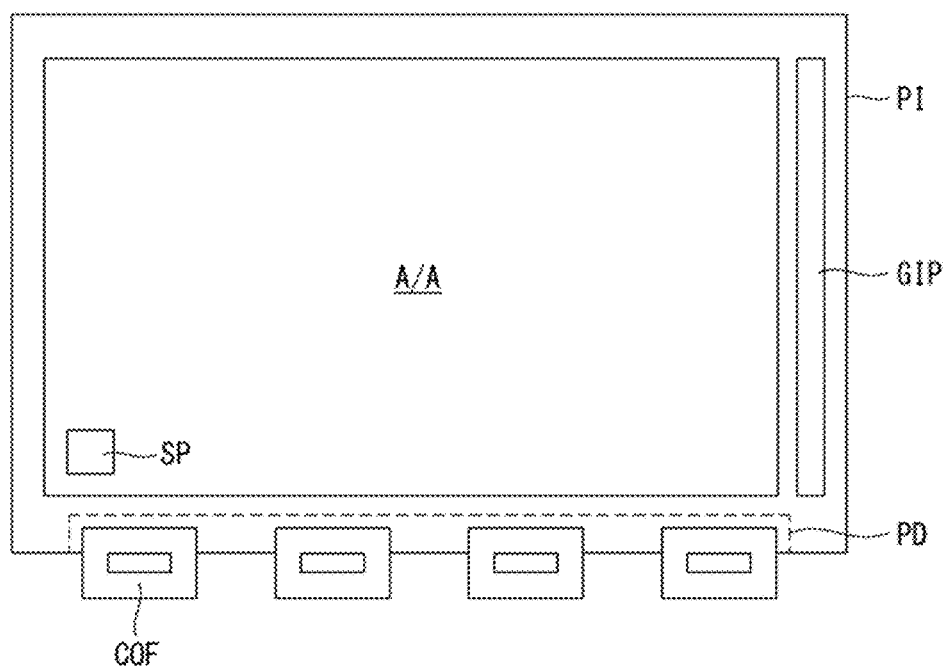
FIG. 4 is a plan view of an OLED display according to an embodiment of the disclosure.
Figure 5:
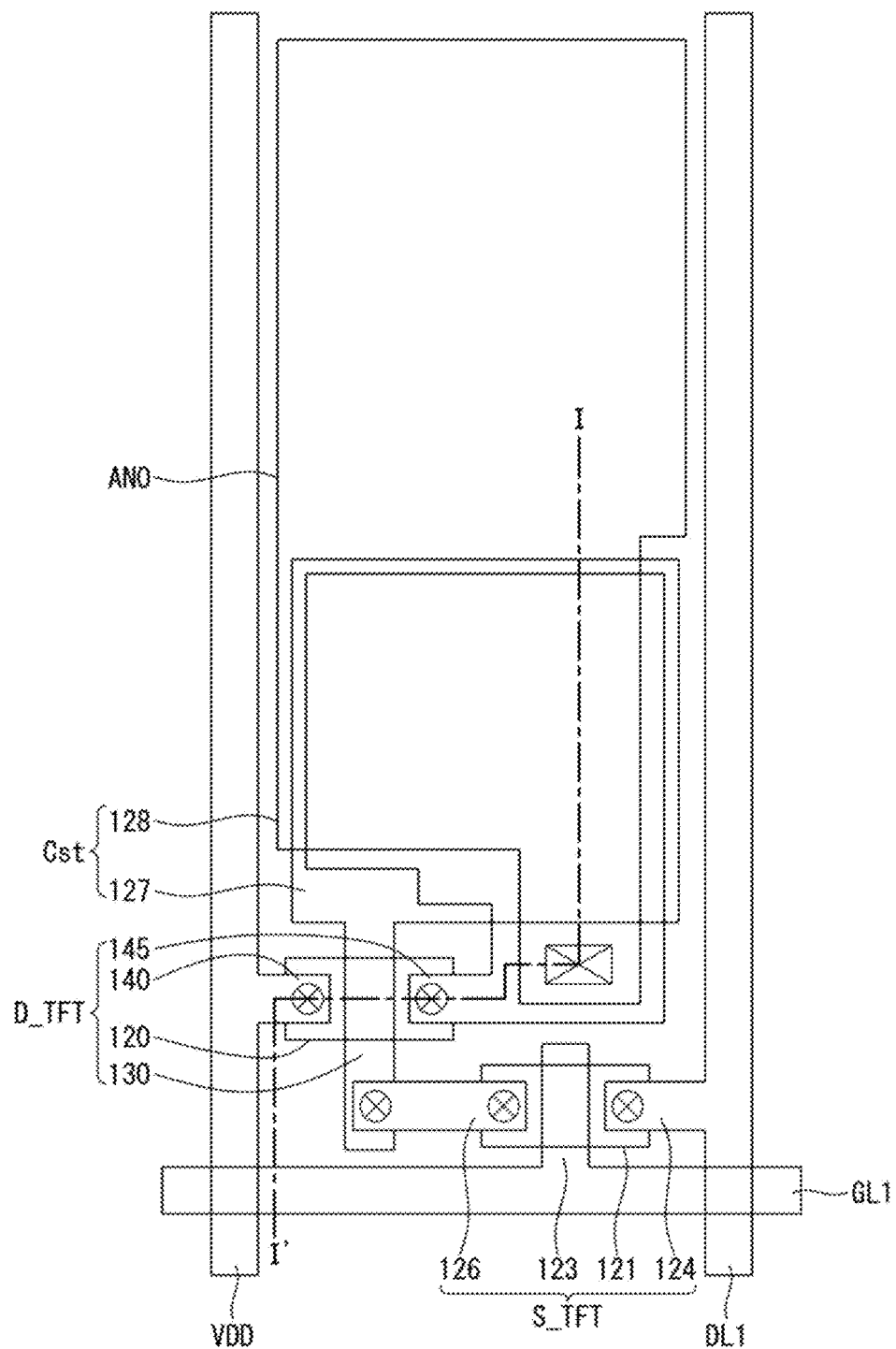
FIG. 5 is a plan view illustrating a subpixel of an OLED display according to an embodiment of the disclosure.

FIG. 4 is a plan view of an OLED display according to an embodiment of the disclosure. FIG. 5 is a plan view illustrating a subpixel of an OLED display according to an embodiment of the disclosure.

Referring to FIG. 4, an OLED display includes a flexible substrate PI, a display unit A/A, a GIP driver GIP disposed on a right side of the flexible substrate PI outside the display unit A/A, and a pad portion PD disposed on a lower side of the flexible substrate PI. The display unit A/A may include a plurality of subpixels SP. For example, R (red), G (green), and B (blue) subpixels or R, B, and W (white) subpixels of the display unit A/A may emit light to represent a full color. The GIP driver GIP is disposed on one side, for example, the right side of the display unit A/A and applies a gate driving signal to the display unit A/A. Chip-on films COF are attached to the pad portion PD disposed on one side, for example, the lower side of the display unit A/A. A data signal and electric power are applied to a plurality of signal lines connected to the display unit A/A through the chip-on films COF.

A planar structure of a subpixel SP of the OLED display according to the embodiment of the disclosure is described below with reference to FIG. 5.

Referring to FIG. 5, the OLED display according to the embodiment of the disclosure disposes a gate line GL1 and a data line DL1 and a power line VDD intersecting the gate line GL1 on the flexible substrate PI to define a subpixel SP. The subpixel SP includes a switching TFT S_TFT, a driving TFT D_TFT, a capacitor Cst, and an organic light emitting diode connected to the driving TFT D_TFT. The switching TFT S_TFT functions to select a pixel. The switching TFT S_TFT includes a semiconductor layer 121, a gate electrode 123 branched from the gate line GL1, a source electrode 124 branched from the data line DL1, and a drain electrode 126. The capacitor Cst includes a capacitor lower electrode 127 connected to the drain electrode 126 of the switching TFT S_TFT and a capacitor upper electrode 128 connected to the power line VDD. The driving TFT D_TFT functions to drive a first electrode ANO of a pixel selected by the switching TFT S_TFT. The driving TFT D_TFT includes a semiconductor layer 120, a gate electrode 130 connected to the capacitor lower electrode 127, a source electrode 140 branched from the power line VDD, and a drain electrode 145. The organic light emitting diode includes a first electrode ANO connected to the drain electrode 145 of the driving TFT D_TFT, an organic layer including an emission layer formed on the first electrode ANO, and a second electrode.

Figure 6:
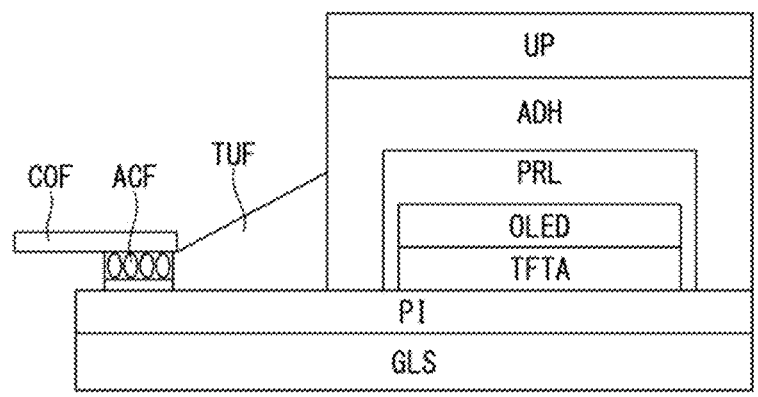
FIGS. 6 to 8 are cross-sectional views illustrating a method of manufacturing an OLED display.
Figure 7:
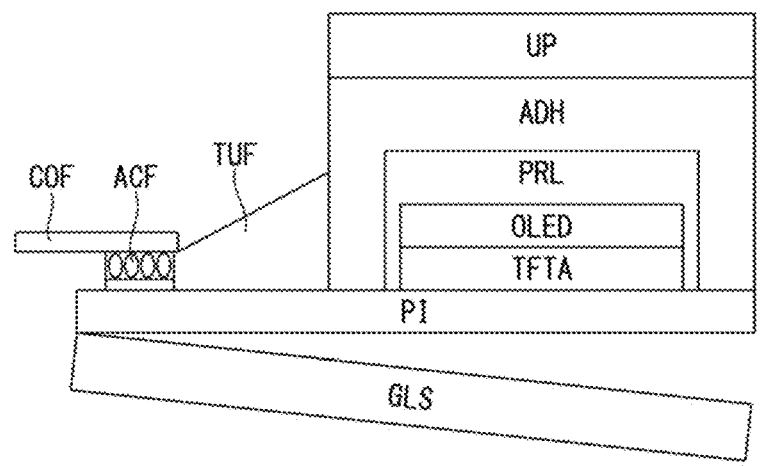
Figure 8:
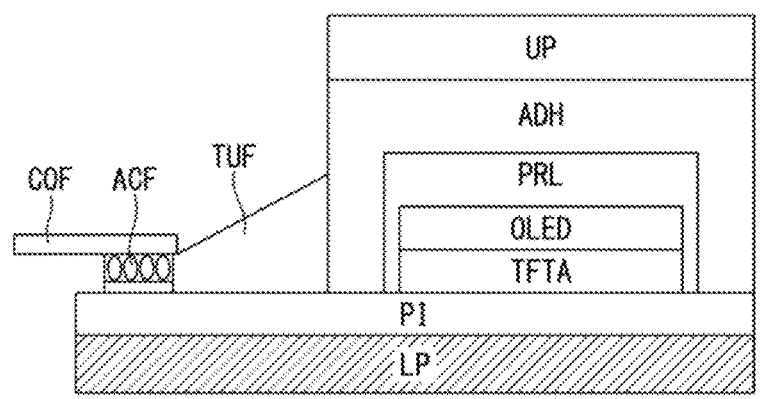
Figure 9:
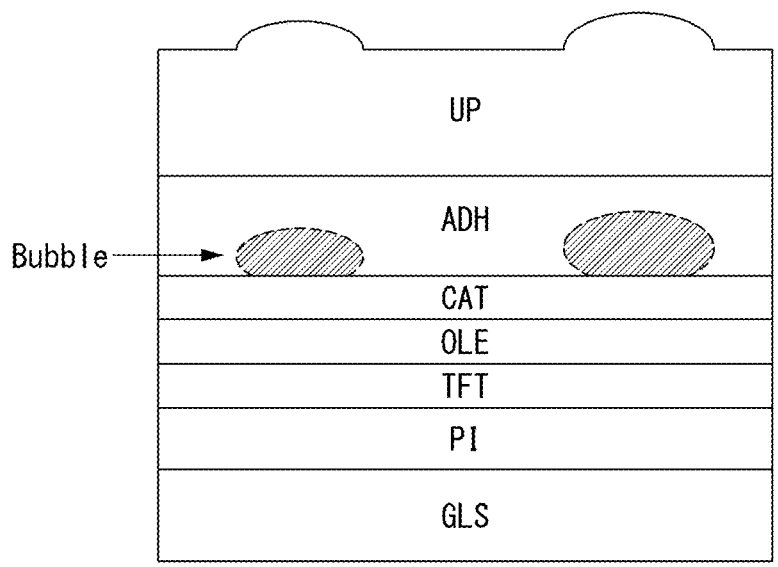
FIGS. 9 and 10 are cross-sectional views illustrating a movement of fine bubbles of an OLED display.
Figure 10:
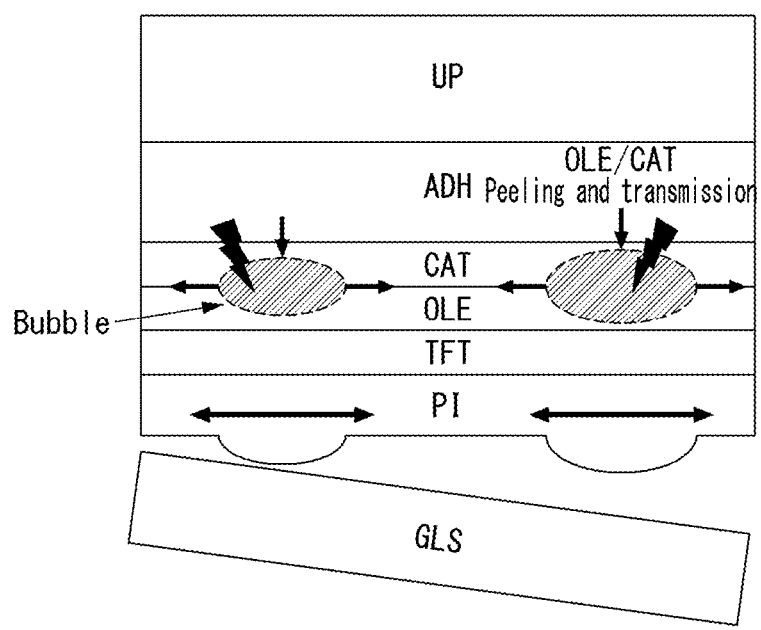

The OLED display according to the embodiment of the disclosure may be manufactured as follows. FIGS. 6 to 8 are cross-sectional views illustrating a method of manufacturing an OLED display. FIGS. 9 and 10 are cross-sectional views illustrating a movement of fine bubbles of an OLED display.

As shown in FIG. 6, polyimide is coated on a glass substrate GLS to form a flexible substrate PI. A TFT array TFTA and an organic light emitting diode OLED are formed on the flexible substrate PI, and a protective layer PRL protecting the TFT array TFTA and the organic light emitting diode OLED is formed on the flexible substrate PI. An upper protective member UP formed of a metal sheet is attached to the flexible substrate PI using an adhesive layer ADH and encapsulates the above components. Subsequently, a chip-on film is attached to a pad portion of the flexible substrate PI using an anisotropic conductive film (ACF), and a tuffy TUF is applied to the pad portion. Next, as shown in FIGS. 7 and 8, the glass substrate GLS positioned below the flexible substrate PI is separated from the flexible substrate PI using a laser. A lower protective member LP formed of a resin film is attached to a lower surface of the flexible substrate PI, from which the glass substrate GLS is removed. Hence, the OLED display is manufactured.

As shown in FIG. 9, fine bubbles are inevitably present in a process for attaching the upper protective member UP to the large-area flexible substrate PI. The fine bubbles are collected in a space (or stepped portion) formed by a height difference of a bank layer defining an emission portion of the organic light emitting diode. However, when a large amount of fine bubbles are generated and exceed a collection capacity of the space, the fine bubbles are present in a flat portion as well as the stepped portion of the bank layer. The fine bubbles appear to protrude from the surface of the upper protective member UP and thus are a problem in an appearance of the OLED display. However, the fine bubbles do not cause a failure in an operation of the OLED display.

However, as shown in FIG. 10, as the glass substrate GLS having a strongest rigidity is separated from the flexible substrate PI, the flexible substrate PI has a strongest rigidity. Thus, bubbles positioned at an upper part of the OLED display are pushed in a vertical direction by a pushing force of the upper protective member UP. The bubbles, that are pushed to a lower part of the OLED display due to the rigidity of the upper protective member UP, peel off an interface between an organic layer OLE and a cathode electrode CAT having a weakest adhesive force, thereby destroying the thin film transistor with a physical force. Hence, a defective operation of the components and many dark spots of the subpixels are generated, and a lower surface (i.e., an image display surface) of the flexible substrate PI protrudes.

Accordingly, the embodiment of the disclosure provides an OLED display capable of preventing the defective operation, the dark spots, etc. by sufficiently securing a collection space of fine bubbles.

Figure 11:
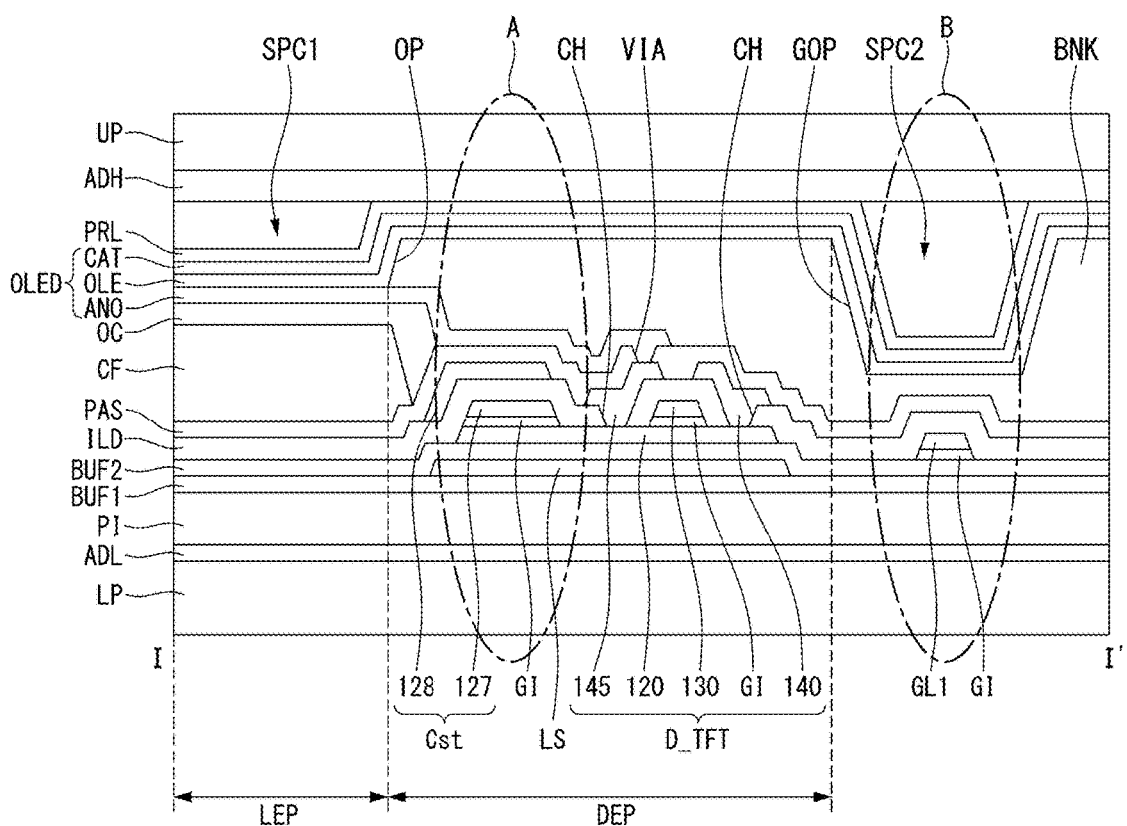
FIG. 11 is a cross-sectional view taken along line I-I' of FIG. 5.
Figure 12:
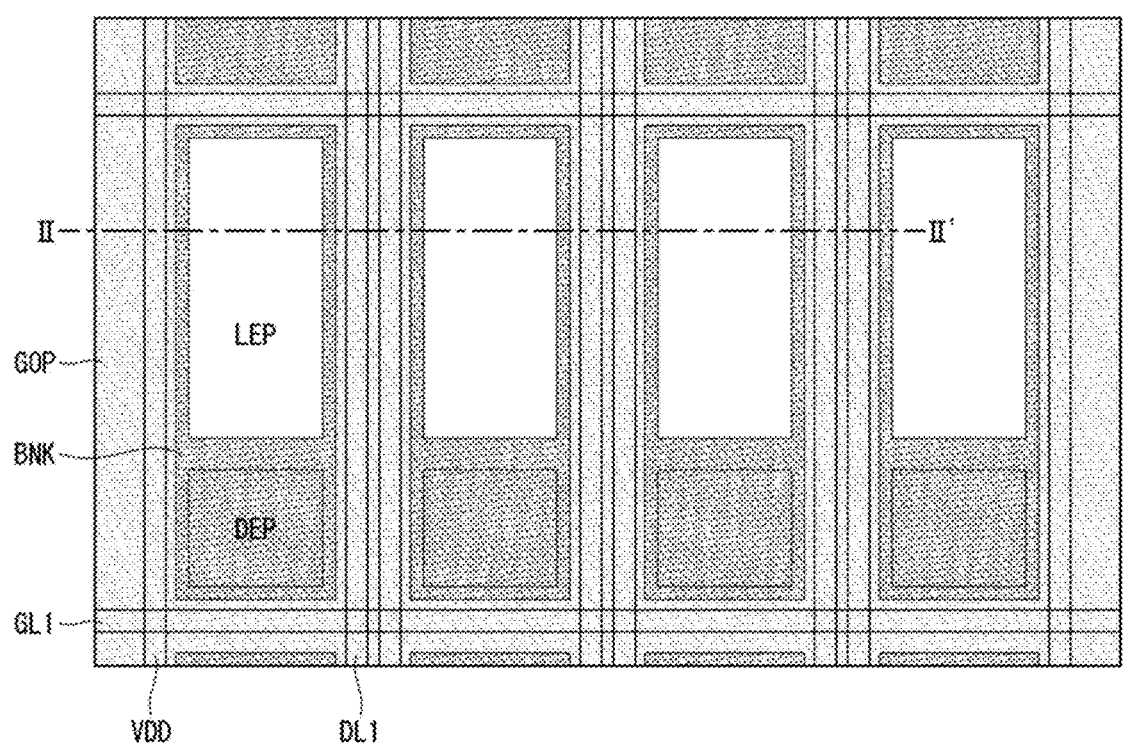
FIGS. 12 to 14 are plan views of subpixels according to an embodiment of the disclosure.
Figure 13:
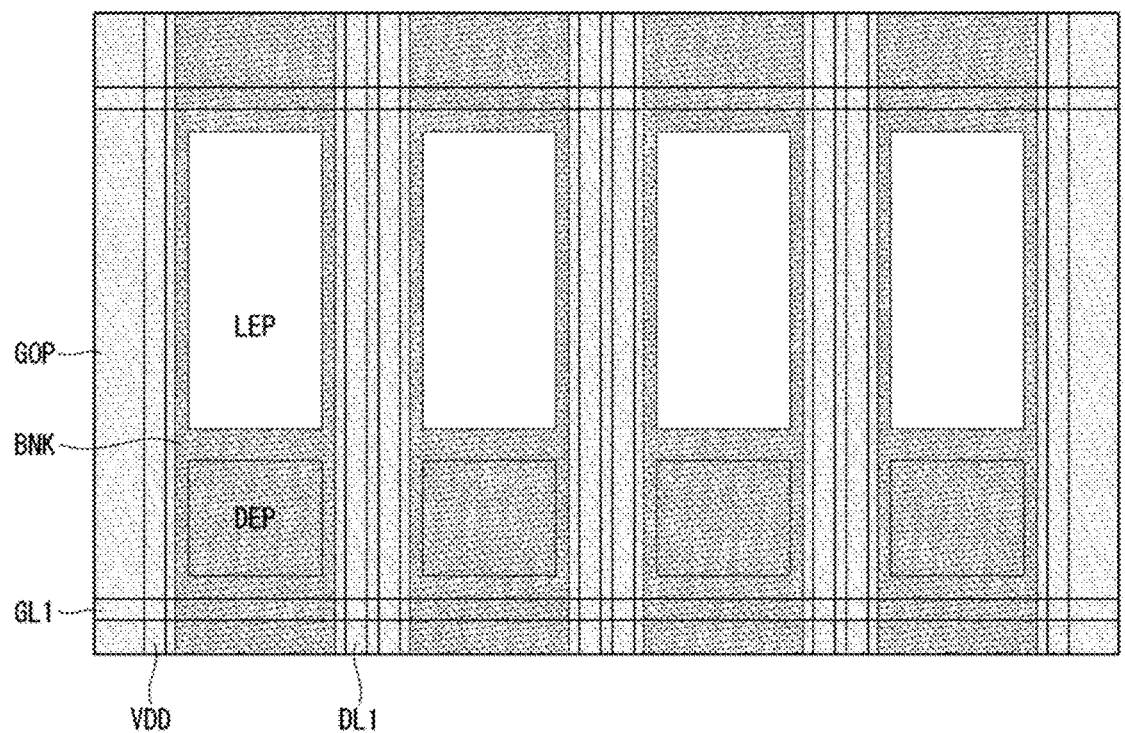
Figure 14:
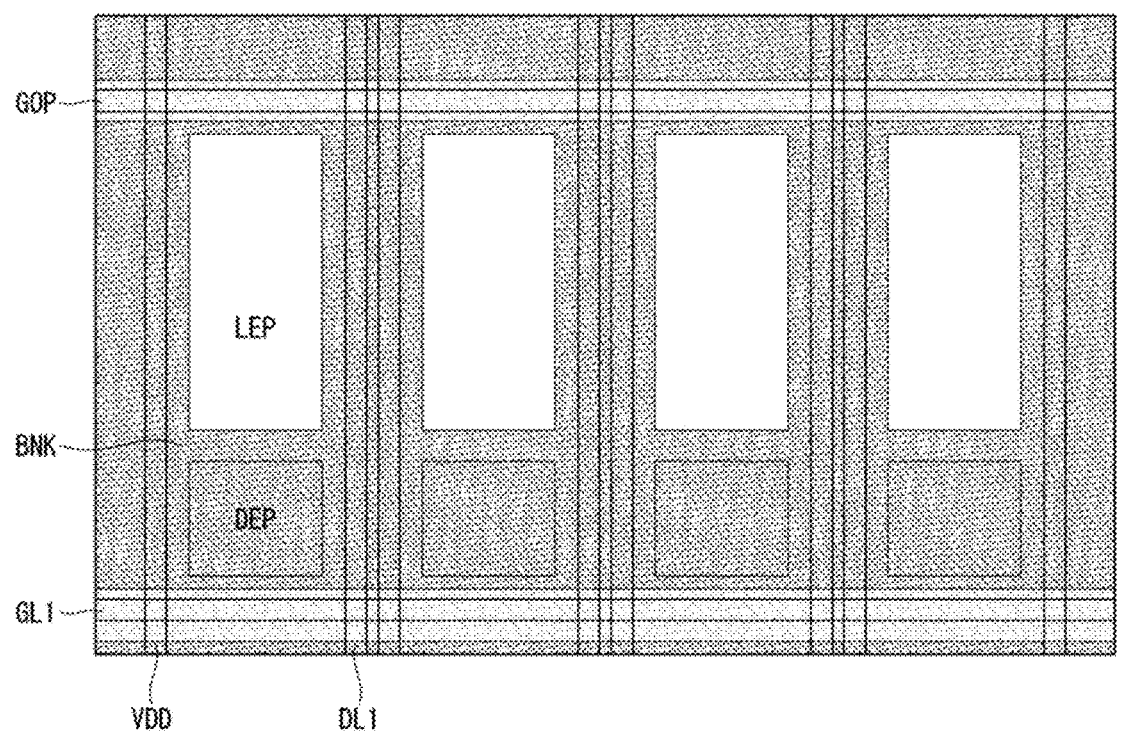
Figure 15:
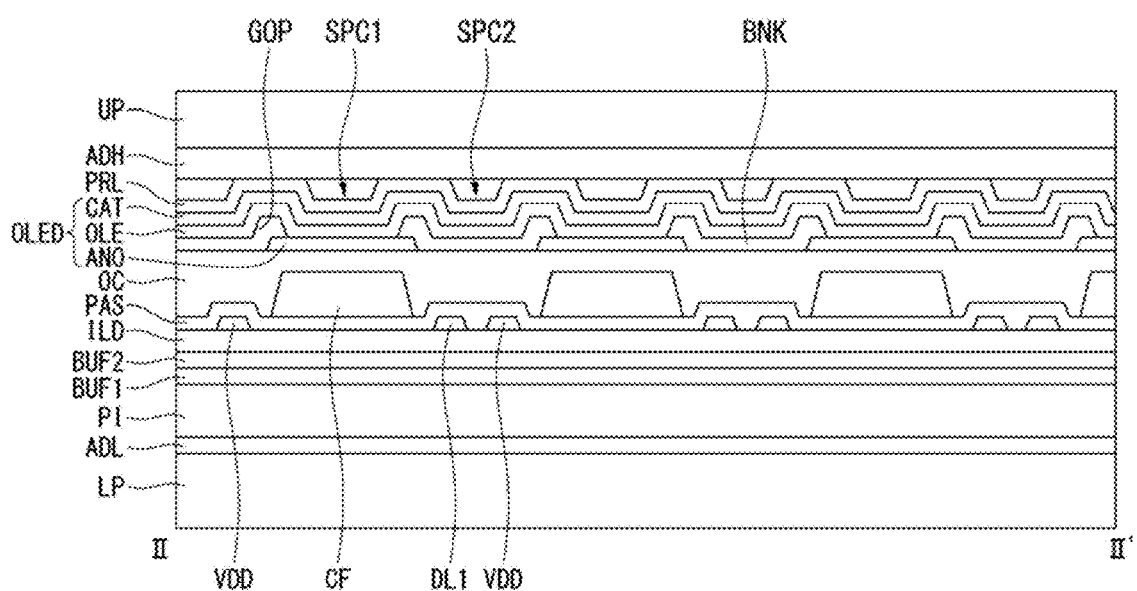
FIG. 15 is a cross-sectional view taken along line II-II' of FIG. 12.
Figure 16:
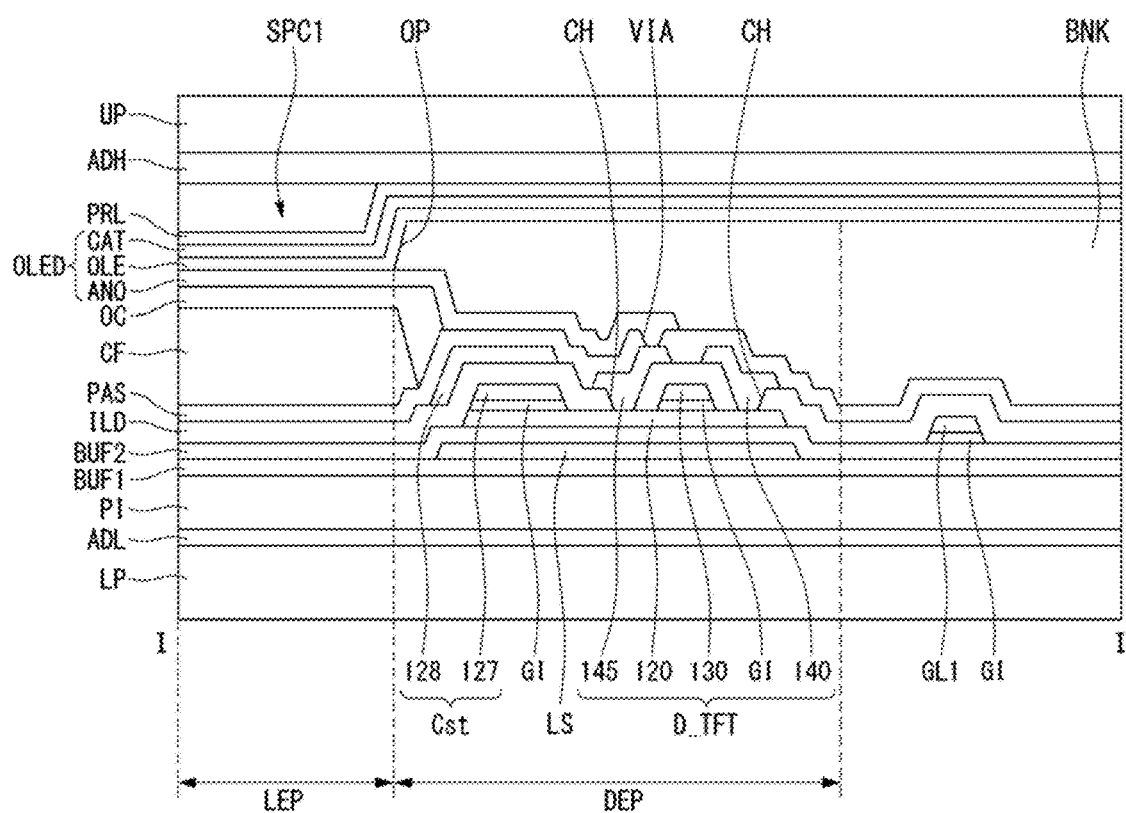
FIG. 16 is a cross-sectional view of an OLED display according to a comparative example.
Figure 17:
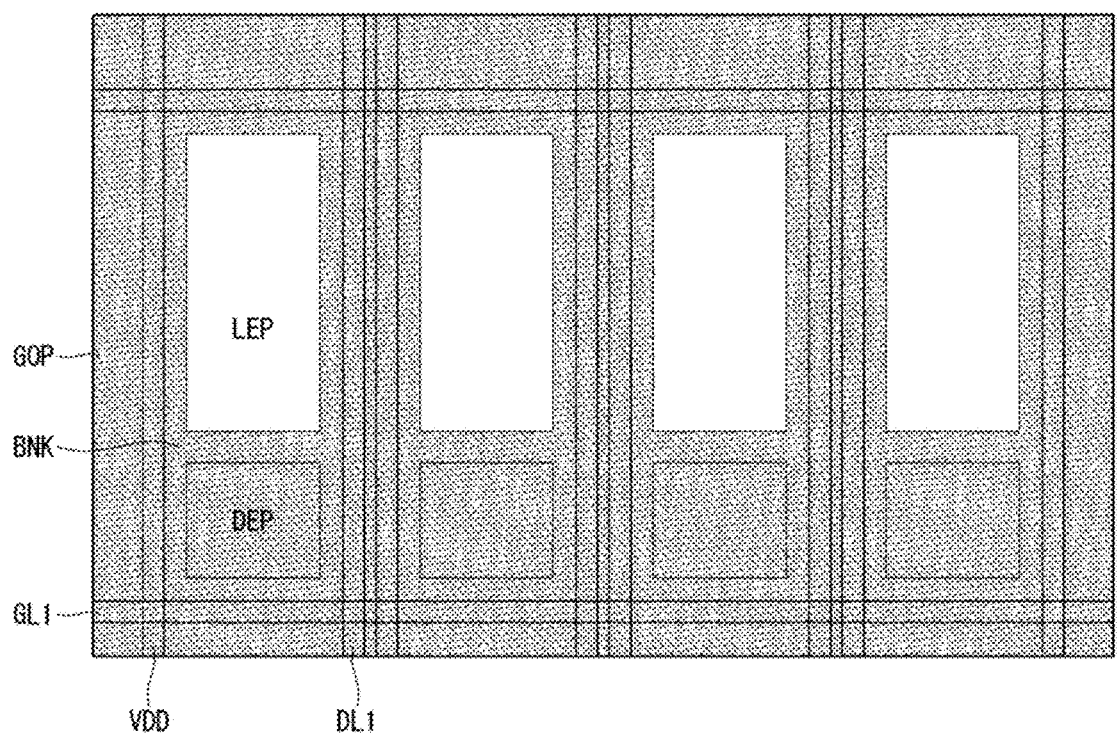
FIG. 17 is a plan view of subpixels according to a comparative example.

FIG. 11 is a cross-sectional view taken along line I-I' of FIG. 5. FIGS. 12 to 14 are plan views of subpixels. FIG. 15 is a cross-sectional view taken along line II-II' of FIG. 12. FIG. 16 is a cross-sectional view of an OLED display according to a comparative example. FIG. 17 is a plan view of subpixels according to a comparative example.

As shown in FIG. 11, in the OLED display according to the embodiment of the disclosure, a first buffer layer BUF1 is positioned on a flexible substrate PI. The flexible substrate PI may be, for example, a polyimide substrate. Thus, the flexible substrate PI according to the embodiment of the disclosure may have flexible characteristic. The first buffer layer BUF1 protects a thin film transistor formed in a subsequent process from impurities, for example, alkali ions discharged from the flexible substrate PI. The first buffer layer BUF1 may be formed of a silicon oxide (SiOx) layer, a silicon nitride (SiNx) layer, or a multilayer thereof.

A shield layer LS is positioned on the first buffer layer BUF1. The shield layer LS prevents a reduction in a panel driving current which may be generated by using a polyimide substrate. A second buffer BUF2 is positioned on the shield layer LS. The second buffer BUF2 protects a thin film transistor formed in a subsequent process from impurities, for example, alkali ions discharged from the shield layer LS. The second buffer layer BUF2 may be formed of a silicon oxide (SiOx) layer, a silicon nitride (SiNx) layer, or a multilayer thereof.

A semiconductor layer 120 is positioned on the second buffer layer BUF2 and may be formed of a silicon semiconductor or an oxide semiconductor. The silicon semiconductor may include amorphous silicon or crystallized polycrystalline silicon. The polycrystalline silicon has high mobility (for example, more than 100 $cm^2/Vs$), low power consumption, and excellent reliability. Thus, the polycrystalline silicon can be applied to a gate driver and/or a multiplexer (MUX) for use in a driving element or applied for a driving TFT of each pixel of the OLED display. Because the oxide semiconductor has a low OFF-current, the oxide semiconductor is suitable for a switching TFT which has a short ON-time and a long OFF-time. Further, because the oxide semiconductor increases a voltage hold time of the pixel due to the low OFF-current, the oxide semiconductor is suitable for a display device requiring a low-speed operation and/or low power consumption. In addition, the semiconductor layer 120 includes a drain region and a source region each including p-type or n-type impurities, and also includes a channel region between the drain region and the source region.

A gate insulating layer GI is positioned on the semiconductor layer 120 and may be formed of a silicon oxide (SiOx) layer, a silicon nitride (SiNx) layer, or a multilayer thereof. A gate electrode 130 is positioned on the gate insulating layer GI at a location corresponding to a predetermined region (i.e., the channel region when impurities are injected) of the semiconductor layer 120. A capacitor lower electrode 127 is disposed on a portion of the semiconductor layer 120 with the gate insulating layer GI interposed therebetween. The gate line GL1 is disposed on the first buffer layer BUF1 with the gate insulating layer GI interposed therebetween. The gate electrode 130 and the capacitor lower electrode 127 may be formed of one of molybdenum (Mo), aluminum (Al), chrome (Cr), gold (Au), titanium (Ti), nickel (Ni), neodymium (Nd), and copper (Cu), or a combination thereof. Further, the gate electrode 130 and the capacitor lower electrode 127 may be a multilayer formed of one of molybdenum (Mo), aluminum (Al), chrome (Cr), gold (Au), titanium (Ti), nickel (Ni), neodymium (Nd), and copper (Cu), or a combination thereof. For example, the gate electrode 130 and the capacitor lower electrode 127 may be formed as a double layer of Mo/Al—Nd or Mo/Al.

An interlayer dielectric layer ILD is positioned on the gate electrode 130 and insulates the gate electrode 130. The interlayer dielectric layer ILD may be formed of a silicon oxide (SiOx) layer, a silicon nitride (SiNx) layer, or a multilayer thereof. Contact holes CH exposing a portion of the semiconductor layer 120 are formed in a portion of the interlayer dielectric layer ILD.

A source electrode 140 and a drain electrode 145 are positioned on the interlayer dielectric layer ILD. The drain electrode 145 is connected to the semiconductor layer 120 through the contact hole CH exposing the drain region of the semiconductor layer 120, and the source electrode 140 is connected to the semiconductor layer 120 through the contact hole CH exposing the source region of the semiconductor layer 120. Further, a capacitor upper electrode 128 is disposed on the interlayer dielectric layer ILD. Each of the source electrode 140, the drain electrode 145, and the capacitor upper electrode 128 may be formed as a single layer or as a multilayer. When each of the source electrode 140, the drain electrode 145, and the capacitor upper electrode 128 is formed as the single layer, each of the source electrode 140, the drain electrode 145, and the capacitor upper electrode 128 may be formed of one of molybdenum (Mo), aluminum (Al), chrome (Cr), gold (Au), titanium (Ti), nickel (Ni), neodymium (Nd), and copper (Cu), or a combination thereof. When each of the source electrode 140, the drain electrode 145, and the capacitor upper electrode 128 is formed as the multilayer, each of the source electrode 140, the drain electrode 145, and the capacitor upper electrode 128 may be formed as a double layer of Mo/Al—Nd or as a triple layer of Ti/Al/Ti, Mo/Al/Mo or Mo/Al-Nd/Mo. Thus, a driving thin film transistor D_TFT including the semiconductor layer 120, the gate electrode 130, the source electrode 140, and the drain electrode 145 is formed.

Further, a passivation layer PAS is positioned on the flexible substrate PI including the driving thin film transistor D_TFT. The passivation layer PAS is an insulating layer protecting the component underlying the passivation layer PAS and may be formed of a silicon oxide (SiOx) layer, a silicon nitride (SiNx) layer, or a multilayer thereof. A color filter CF is positioned on the passivation layer PAS. The color filter CF serves to convert white light emitted by an organic light emitting diode OLED into red, green, or blue light. An overcoat layer OC is positioned on the color filter CF. The overcoat layer OC may be a planarization layer for reducing a height difference (or step coverage) of an underlying structure and may be formed of an organic material such as polyimide, benzocyclobutene-based resin, and acrylate. For example, the overcoat layer OC may be formed through a spin-on glass (SOG) method for coating the organic material in a liquid state and then curing the organic material.

A via hole VIA exposing the drain electrode 145 of the driving thin film transistor D_TFT is positioned in a portion of the overcoat layer OC. The organic light emitting diode OLED is positioned on the overcoat layer OC. More specifically, a first electrode ANO is positioned on the overcoat layer OC. The first electrode ANO serves as a pixel electrode and is connected to the drain electrode 145 of the driving thin film transistor D_TFT through the via hole VIA. The first electrode ANO is an anode and may be formed of a transparent conductive material such as indium tin oxide (ITO), indium zinc oxide (IZO), and zinc oxide (ZnO). When the first electrode ANO is a reflective electrode, the first electrode ANO may further include a reflective layer.

The reflective layer may be formed of aluminum (Al), copper (Cu), silver (Ag), nickel (Ni), palladium (Pd) or a combination thereof. For example, the reflective layer may be formed of an Ag/Pd/Cu (APC) alloy.

In addition, a bank layer BNK defining pixels is positioned on the flexible substrate PI including the first electrode ANO. The bank layer BNK may be formed of an organic material such as polyimide, benzocyclobutene-based resin, and acrylate. The bank layer BNK includes a pixel definition portion OP exposing the first electrode ANO. An organic layer OLE contacting the first electrode ANO is positioned at a front surface of the flexible substrate PI. The organic layer OLE is a layer where electrons and holes combine and emit light. A hole injection layer and/or a hole transport layer may be positioned between the organic layer OLE and the first electrode ANO, and an electron injection layer and/or an electron transport layer may be positioned on the organic layer OLE.

A second electrode CAT is positioned on the organic layer OLE and may be positioned on a front surface of the display unit A/A (see FIG. 4). In addition, the second electrode CAT is a cathode electrode and may be formed of magnesium (Mg), calcium (Ca), aluminum (Al), silver (Ag), or a combination thereof each having a low work function. When the second electrode CAT is a transmissive electrode, the second electrode CAT may be thin enough to transmit light. Further, when the second electrode CAT is a reflective electrode, the second electrode CAT may be thick enough to reflect light.

A protective layer PRL is disposed on an upper surface of the flexible substrate PI, on which the driving thin film transistor D_TFT and the organic light emitting diode OLED are formed, and an upper protective member UP is attached to an upper part of the protective layer PRL through an adhesive layer ADH. The upper protective member UP may be a metal sheet. In addition, a lower protective member LP is attached to a lower surface of the flexible substrate PI through the adhesive layer ADH. Because the lower protective member LP has to transmit light, the lower protective member LP may be formed of a transparent resin film.

The OLED display according to the embodiment of the disclosure includes an emission portion LEP emitting light from the organic layer OLE, and a circuit portion DEP in which elements such as the driving thin film transistor D_TFT, the switching thin film transistor, and the capacitor Cst are formed.

The bank layer BNK according to the embodiment of the disclosure includes a groove portion GOP formed by concavely depressing a portion of the bank layer BNK. The bank layer BNK has a height difference (or a stepped portion) corresponding to the pixel definition portion OP exposing the organic layer OLE. The stepped portion formed by the pixel definition portion OP of the bank layer BNK forms a first collection space SPC1 between the protective layer PRL and the adhesive layer ADH of the upper protective member UP and can collect bubbles. However, because the first collection space SPC1 cannot collect all the bubbles of the OLED display, the embodiment of the disclosure additionally forms the groove portion GOP in the bank layer BNK and further includes a second collection space SPC2. A height difference (or a stepped portion) formed by the groove portion GOP of the bank layer BNK forms the second collection space SPC2 between the protective layer PRL and the adhesive layer ADH of the upper protective member UP and can collect bubbles.

Referring to FIGS. 11 and 12, the groove portion GOP of the bank layer BNK is disposed in a remaining area excluding the emission portion LEP and the circuit portion DEP of the subpixel. The groove portion GOP of the bank layer BNK may overlap at least one of the gate line GL1, the data line DL1, and the power line VDD. The pixel definition portion OP is formed in the emission portion LEP, and it is difficult to form the groove portion GOP in the circuit portion DEP because of a large height difference of the groove portion GOP. Thus, the groove portion GOP does not overlap the first electrode ANO and the driving thin film transistor D_TFT. In FIG. 11, the adhesive layer ADH selectively contacts the protective layer PRL at the circuit portion DEP. Also, the first collection space SPC1 is shallower than the second collection space SPC2.

As shown in FIG. 13, the groove portion GOP of the bank layer BNK may be disposed to overlap the data line DL1 and the power line VDD. In addition, as shown in FIG. 14, the groove portion GOP of the bank layer BNK may be disposed to overlap the gate line GL1. Thus, the groove portion GOP of the bank layer BNK according to the embodiment of the disclosure may be disposed anywhere except the emission portion LEP and the circuit portion DEP.

Referring again to FIG. 11, the groove portion GOP of the bank layer BNK may be formed in a shape of a groove by removing a portion of the bank layer BNK, but is not limited thereto. For example, the groove portion GOP may be formed in a shape of a hole or a trench exposing the passivation layer PAS below the bank layer BNK by completely removing the bank layer BNK. Further, a depth of the groove portion GOP is not particularly limited. Namely, the depth of the groove portion GOP does not matter much as long as the groove portion GOP of the bank layer BNK can form the height difference.

Referring to FIG. 15, when the groove portion GOP of the bank layer BNK is disposed to overlap the data line DL1 and the power line VDD, the groove portion GOP of the bank layer BNK is disposed between the emission portions LEP of the adjacent subpixels.

As described above, the OLED display according to the embodiment of the disclosure can sufficiently secure the collection space of bubbles by forming the groove portion GOP in the bank layer BNK, thereby preventing the defective operation and the dark spots resulting from the bubbles.

Referring to FIGS. 16 and 17, because an OLED display according to a comparative example includes only a first collection space SPC1 in an emission portion LEP, the OLED display according to the comparative example has a difficulty in collecting a large amount of bubbles. Hence, the comparative example has difficulty in preventing a defective operation and many dark spots resulting from the bubbles.

Figure 18:
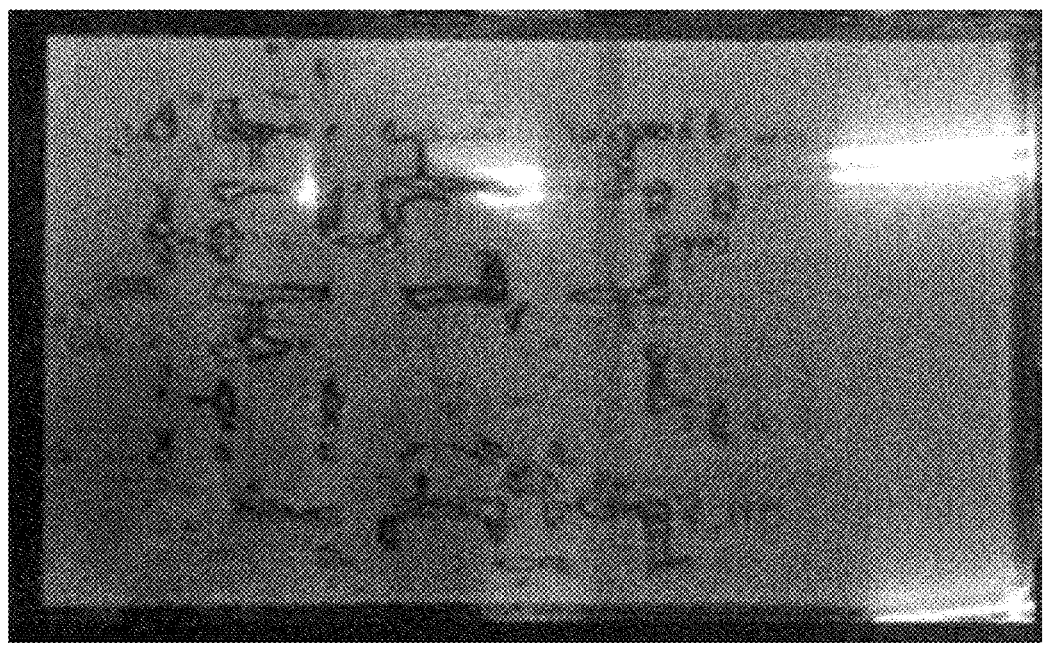
Figure 19:
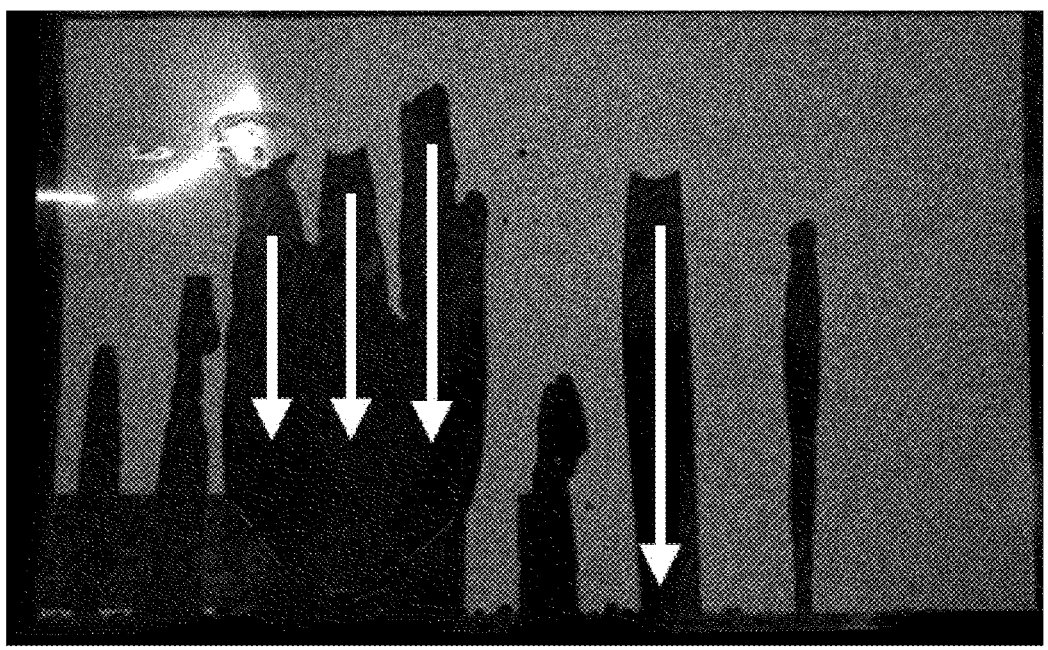
Figure 20:
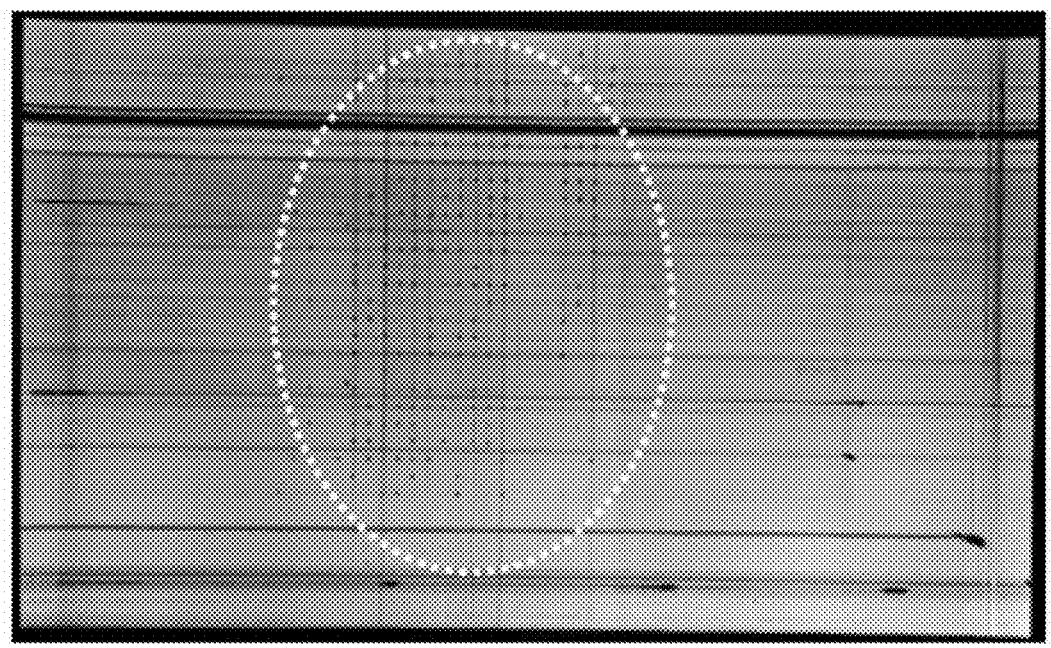

FIGS. 18 to 20 illustrate images when an OLED display according to a comparative example is turned on.

As shown in FIG. 18, in an OLED display according to a comparative example, the peeling resulting from bubbles appeared between an organic layer and a second electrode. As shown in FIG. 19, after a lamination process for attaching a lower protective member to a lower part of a flexible substrate was performed, the peeling resulting from bubbles more deeply appeared between the organic layer and the second electrode. As shown in FIG. 20, when the OLED display according to the comparative example was turned on, many dark spots occurred.

On the other hand, the OLED display according to the embodiment of the disclosure forms the groove portion in the bank layer and thus can sufficiently secure a bubble collection space capable of collecting the bubbles.

A plane area of a bubble collection space in the OLED display according to the comparative example and the OLED display according to the embodiment of the disclosure was measured and is shown in the following Table 1.

TABLE 1

| | Percentage of plane area of collection space of bank layer (%) |
|---|---|
| Comparative example | 33.48 |
| Embodiment | 54.26 |

As indicated by the above Table 1, the OLED display according to the embodiment of the disclosure includes the groove portion in the bank layer, and thus can increase a plane area of the bubble collection space by about 1.6 times as compared to the comparative example.

Further, the OLED display according to the embodiment of the disclosure includes the groove portion in the bank layer, and thus can reduce a stress of a laminated structure.

Figure 21:
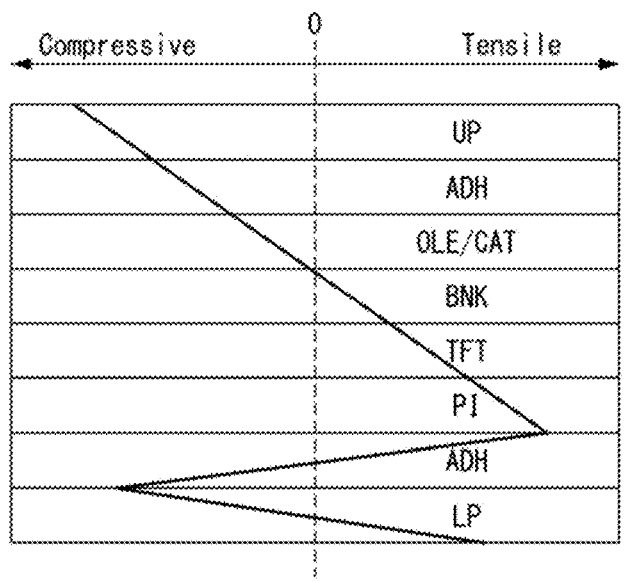
FIG. 21 illustrates a stress pattern in an area "A" of FIG. 11.
Figure 22:
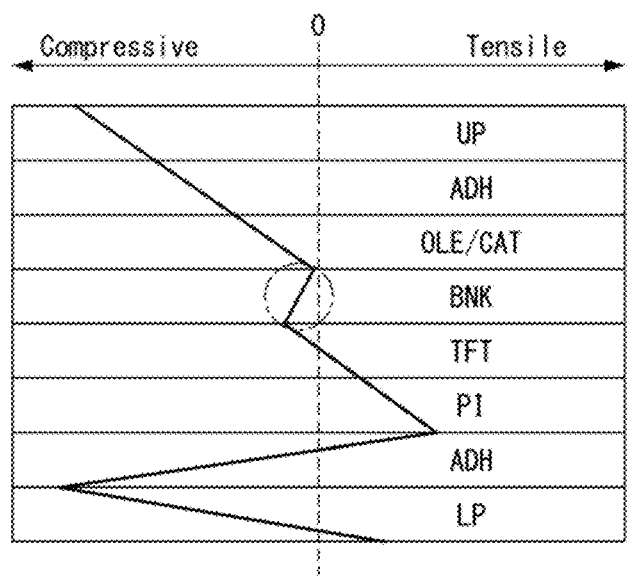
FIG. 22 illustrates a stress pattern in an area "B" of FIG. 11.

FIG. 21 illustrates a stress pattern in an area "A" of FIG. 11, and FIG. 22 illustrates a stress pattern in an area "B" of FIG. 11.

As shown in FIG. 21, in the area "B" in which the groove portion is formed in the bank layer, a stress is reduced by the groove portion of the bank layer. However, as shown in FIG. 22, in the area "A" in which the groove portion is not formed in the bank layer, a stress is greatly applied to the bank layer.

Accordingly, the embodiment of the disclosure includes the groove portion in the bank layer and thus can entirely reduce the stress applied to the OLED display. Hence, the embodiment of the disclosure can prevent laminated layers from being damaged by stress even if an operation of bending or stretching the OLED display is repeatedly performed.

As described above, the OLED display according to the embodiment of the disclosure includes the groove portion in the bank layer and additionally secures a collection space of bubbles, thereby preventing the defective operation and the dark spots resulting from the bubbles. Further, the OLED display according to the embodiment of the disclosure can prevent laminated layers from being damaged by stress through a reduction in the entire stress of the OLED display even if an operation of bending or stretching the OLED display is repeatedly performed.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising:
a flexible substrate;
a thin film transistor disposed on the flexible substrate;
a first electrode connected to the thin film transistor;
a bank layer including a pixel definition portion exposing the first electrode and a groove portion spaced apart from the pixel definition portion;
an organic layer disposed on the first electrode and the bank layer; and
a second electrode disposed on the organic layer.

2. The display device of claim 1, wherein the groove portion is a concaved portion of the bank layer or is in a shape of a hole passing through the bank layer.

3. The display device of claim 1, wherein the groove portion does not overlap the thin film transistor and the first electrode.

4. The display device of claim 1, further comprising:
a protective layer disposed on the second electrode;
an adhesive layer disposed on the protective layer; and
an upper protective member disposed on the adhesive layer.

5. The display device of claim 4, wherein a first collection space is provided between the protective layer and the adhesive layer in the pixel definition portion of the bank layer, and
wherein a second collection space is provided between the protective layer and the adhesive layer in the groove portion of the bank layer.

6. A display device comprising:
a plurality of subpixels defined by an intersection of gate lines, data lines, and power lines on a flexible substrate, the data lines and the power lines intersecting the gate lines,
wherein each subpixel includes:
an emission portion emitting light and a circuit portion in which a thin film transistor is disposed;
a first electrode connected to the thin film transistor;
a bank layer including a pixel definition portion exposing the first electrode and a groove portion spaced apart from the pixel definition portion;
an organic layer disposed on the first electrode and the bank layer; and
a second electrode disposed on the organic layer.

7. The display device of claim 6, wherein the groove portion overlaps at least one of the gate lines.

8. The display device of claim 6, wherein the groove portion overlaps at least one of the data lines and at least one of the power lines.

9. The display device of claim 6, wherein the groove portion is a concaved portion of the bank layer or is in a shape of a hole passing through the bank layer.

10. The display device of claim 6, wherein the groove portion does not overlap the thin film transistor and the first electrode.

11. The display device of claim 6, further comprising:
a protective layer disposed on the second electrode;
an adhesive layer disposed on the protective layer; and
an upper protective member disposed on the adhesive layer.

12. The display device of claim 11, wherein a first collection space is provided between the protective layer and the adhesive layer in the pixel definition portion of the bank layer, and
wherein a second collection space is provided between the protective layer and the adhesive layer in the groove portion of the bank layer.

13. A display device comprising:
a flexible substrate having an emission portion and a circuit portion;
a thin film transistor disposed on the flexible substrate at the circuit portion;
a first electrode connected to the thin film transistor;
an organic layer disposed on the first electrode;
a protective layer disposed on the organic layer;
an adhesive layer selectively contacting the protective layer at the circuit portion and not at the emission portion; and
a second electrode disposed on the organic layer.

14. A display device comprising:
a flexible substrate having an emission portion and a circuit portion;
a thin film transistor disposed on the flexible substrate at the circuit portion;
a first electrode connected to the thin film transistor;
an organic layer disposed on the first electrode;
a protective layer disposed on the organic layer;
an adhesive layer selectively contacting the protective layer; and
a second electrode disposed on the organic layer,
wherein a first collection space is provided between the protective layer and the adhesive layer at the emission portion.

15. The display device of claim 14, wherein a second collection space is provided between the protective layer and the adhesive layer away from the emission portion and the circuit portion.

16. The display device of claim 15, further comprising a bank layer including a pixel definition portion exposing the first electrode and a groove portion spaced apart from the pixel definition portion,
wherein the first collection space is at the pixel defining portion and the second collection space is at the groove portion.

17. The display device of claim 16, wherein the first collection space is shallower than the second collection space.

18. The display device of claim 16, wherein the groove portion is a concaved portion of the bank layer or is in a shape of a hole passing through the bank layer.

19. The display device of claim 16, wherein the groove portion does not overlap the thin film transistor and the first electrode.

20. The display device of claim 14, wherein the adhesive layer contacts the protective layer at the circuit portion.

* * * * *